(12) United States Patent
Tamaki

(10) Patent No.: US 10,347,713 B2
(45) Date of Patent: Jul. 9, 2019

(54) SEMICONDUCTOR DEVICE HAVING A TRIPLE REGION RESURF STRUCTURE

(71) Applicants: Kabushiki Kaisha Toshiba, Minato-ku (JP); Toshiba Electronic Devices & Storage Corporation, Minato-ku (JP)

(72) Inventor: Tomohiro Tamaki, Nonoichi (JP)

(73) Assignees: Kabushiki Kaisha Toshiba, Minato-ku (JP); Toshiba Electronic Devices & Storage Corporation, Minato-ku (JP)

( * ) Notice: Subject to any disclaimer, the term of this patent is extended or adjusted under 35 U.S.C. 154(b) by 0 days.

(21) Appl. No.: 15/912,697

(22) Filed: Mar. 6, 2018

(65) Prior Publication Data

US 2019/0088737 A1 Mar. 21, 2019

(30) Foreign Application Priority Data

Sep. 15, 2017 (JP) .................................. 2017-178414

(51) Int. Cl.
*H01L 29/06* (2006.01)
*H01L 29/10* (2006.01)
(Continued)

(52) U.S. Cl.
CPC ...... *H01L 29/0619* (2013.01); *H01L 29/0634* (2013.01); *H01L 29/1095* (2013.01);
(Continued)

(58) Field of Classification Search
CPC ............. H01L 29/0619; H01L 29/0634; H01L 29/1095; H01L 29/404; H01L 29/66143; H01L 29/872
See application file for complete search history.

(56) References Cited

U.S. PATENT DOCUMENTS 5,969,400 A * 10/1999 Shinohe .............. H01L 27/0761
257/170
6,215,168 B1 4/2001 Brush et al.
(Continued)

FOREIGN PATENT DOCUMENTS

EP 1 071 135 A2 1/2001
EP 3 046 149 A1 7/2016
(Continued)

OTHER PUBLICATIONS

T. Tamaki et al. "Vertical Charge Imbalance Effect on 600 V-class Trench-Filling Superjunction Power MOSFETs", Proceedings of the 23$^{rd}$ International Symposium on Power Semiconductor Devices & IC's, May 23-26, 2011, 4 pages.

*Primary Examiner* — Ida M Soward
(74) *Attorney, Agent, or Firm* — Oblon, McClelland, Maier & Neustadt, L.L.P.

(57) ABSTRACT

A semiconductor device according to an embodiment includes a semiconductor layer having first and second planes; first and second electrodes; a first semiconductor region of a first conductivity type in the semiconductor layer; a second semiconductor region of a second conductivity type between the first semiconductor region and the first plane; and a third semiconductor region of the second conductivity type surrounding the second semiconductor region. The third semiconductor region includes a first region, a second region, and a third region. A first region, a second region, and a third region are closer to the second semiconductor region in this order. An amount of second-conductivity-type impurities in the first region, the second region, and the third region is less than that of the second semiconductor region. An amount of second-conductivity-type impurities in the second region is higher than that in the first region and the third region.

11 Claims, 10 Drawing Sheets

(51) Int. Cl.
  *H01L 29/40* (2006.01)
  *H01L 29/66* (2006.01)
  *H01L 29/87* (2006.01)
  *H01L 29/872* (2006.01)
(52) U.S. Cl.
  CPC ...... *H01L 29/404* (2013.01); *H01L 29/66143* (2013.01); *H01L 29/872* (2013.01); *H01L 29/0692* (2013.01)

(56) References Cited

U.S. PATENT DOCUMENTS

| | | | |
|---|---|---|---|
| 7,808,003 B2* | 10/2010 | Endo | H01L 29/872 257/77 |
| 8,017,981 B2* | 9/2011 | Sankin | H01L 27/098 257/265 |
| 8,460,977 B2* | 6/2013 | Zhang | H01L 29/0615 438/142 |
| 8,716,717 B2* | 5/2014 | Kawakami | H01L 29/0634 257/288 |
| 8,749,017 B2 | 6/2014 | Lu | |
| 8,772,869 B2* | 7/2014 | Saito | H01L 29/0634 257/342 |
| 8,901,699 B2* | 12/2014 | Ryu | H01L 29/872 257/475 |
| 9,105,486 B2* | 8/2015 | Narazaki | H01L 29/0615 |
| 9,219,113 B2 | 12/2015 | Takahashi et al. | |
| 9,287,391 B2 | 3/2016 | Chen et al. | |
| 9,312,332 B2 | 4/2016 | Lu | |
| 9,324,816 B2 | 4/2016 | Matsudai et al. | |
| 9,508,792 B2 | 11/2016 | Kawakami et al. | |
| 9,508,870 B2 | 11/2016 | Nishii et al. | |
| 9,601,639 B2 | 3/2017 | Masuoka et al. | |
| 9,608,058 B1* | 3/2017 | Ohara | H01L 29/0634 |
| 9,620,600 B2* | 4/2017 | Ohara | H01L 29/7811 |
| 9,653,557 B2 | 5/2017 | Matsudai et al. | |
| 9,673,315 B2* | 6/2017 | Shimizu | H01L 21/045 |
| 2008/0001159 A1* | 1/2008 | Ota | H01L 29/0623 257/77 |
| 2009/0008651 A1* | 1/2009 | Okuno | H01L 29/6606 257/77 |
| 2010/0025693 A1* | 2/2010 | Malhan | H01L 29/063 257/76 |
| 2010/0244049 A1* | 9/2010 | Yamamoto | H01L 21/0465 257/77 |
| 2011/0053374 A1 | 3/2011 | Kobayashi | |
| 2014/0374791 A1 | 12/2014 | Matsudai et al. | |
| 2015/0001552 A1 | 1/2015 | Hori et al. | |
| 2015/0021747 A1 | 1/2015 | Nishii et al. | |
| 2015/0102452 A1 | 4/2015 | Kamibaba et al. | |
| 2015/0206941 A1* | 7/2015 | Uehigashi | H01L 29/872 257/77 |
| 2015/0221721 A1 | 8/2015 | Kawakami et al. | |
| 2015/0255535 A1 | 9/2015 | Taguchi et al. | |
| 2016/0020276 A1 | 1/2016 | Lu | |
| 2016/0035840 A1 | 2/2016 | Matsudai et al. | |
| 2016/0056306 A1 | 2/2016 | Masuoka et al. | |
| 2016/0218187 A1 | 7/2016 | Mochizuki et al. | |
| 2016/0315169 A1* | 10/2016 | Yoshikawa | H01L 29/6603 |
| 2016/0372540 A1 | 12/2016 | Kitamura | |
| 2017/0018605 A1 | 1/2017 | Mochizuki et al. | |
| 2017/0077038 A1* | 3/2017 | Mizukami | H01L 23/544 |
| 2017/0084701 A1 | 3/2017 | Kitamura | |
| 2017/0154953 A1* | 6/2017 | Wada | H01L 29/06 |
| 2017/0179235 A1 | 6/2017 | Kinoshita | |
| 2017/0271443 A1* | 9/2017 | Ohara | H01L 29/1608 |
| 2018/0108789 A1 | 4/2018 | Vobecky | |
| 2018/0114829 A1* | 4/2018 | Nagaoka | H01L 29/063 |
| 2018/0233563 A1* | 8/2018 | Hiyoshi | H01L 29/7802 |

FOREIGN PATENT DOCUMENTS

| | | |
|---|---|---|
| JP | H07-193018 | 7/1995 |
| JP | 2009-503830 | 1/2009 |
| JP | 2009-277809 A | 11/2009 |
| JP | 2010-225833 | 10/2010 |
| JP | 2011-49258 | 3/2011 |
| JP | 2011-71160 | 4/2011 |
| JP | 2011-199223 | 10/2011 |
| JP | 2011-204710 | 10/2011 |
| JP | 4966348 | 7/2012 |
| JP | 2012-151143 A | 8/2012 |
| JP | 2012-182463 | 9/2012 |
| JP | 2012-186479 | 9/2012 |
| JP | 5087542 | 12/2012 |
| JP | 2014-38937 | 2/2014 |
| JP | 5515922 | 6/2014 |
| JP | 5517688 | 6/2014 |
| JP | 5580361 | 8/2014 |
| JP | 2014-175377 | 9/2014 |
| JP | 2014-179528 | 9/2014 |
| JP | 5586650 | 9/2014 |
| JP | 2014-241367 | 12/2014 |
| JP | 2015-8281 | 1/2015 |
| JP | 2015-26797 | 2/2015 |
| JP | 2015-76437 | 4/2015 |
| JP | 2015-76544 | 4/2015 |
| JP | 5701447 | 4/2015 |
| JP | 5716865 | 5/2015 |
| JP | 5784242 | 9/2015 |
| JP | 2016-21539 | 2/2016 |
| JP | 2016-35989 | 3/2016 |
| JP | 5895038 | 3/2016 |
| JP | 5921784 | 5/2016 |
| JP | 5971414 | 8/2016 |
| WO | WO 2007/012490 A1 | 2/2007 |
| WO | WO 2013/153668 A1 | 10/2013 |
| WO | WO 2014/054319 A1 | 4/2014 |
| WO | WO 2014/199465 A1 | 12/2014 |
| WO | WO 2015/104900 A1 | 7/2015 |
| WO | WO 2016/043247 A1 | 3/2016 |
| WO | WO 2016/103814 A1 | 6/2016 |
| WO | WO 2016/198388 A1 | 12/2016 |

\* cited by examiner

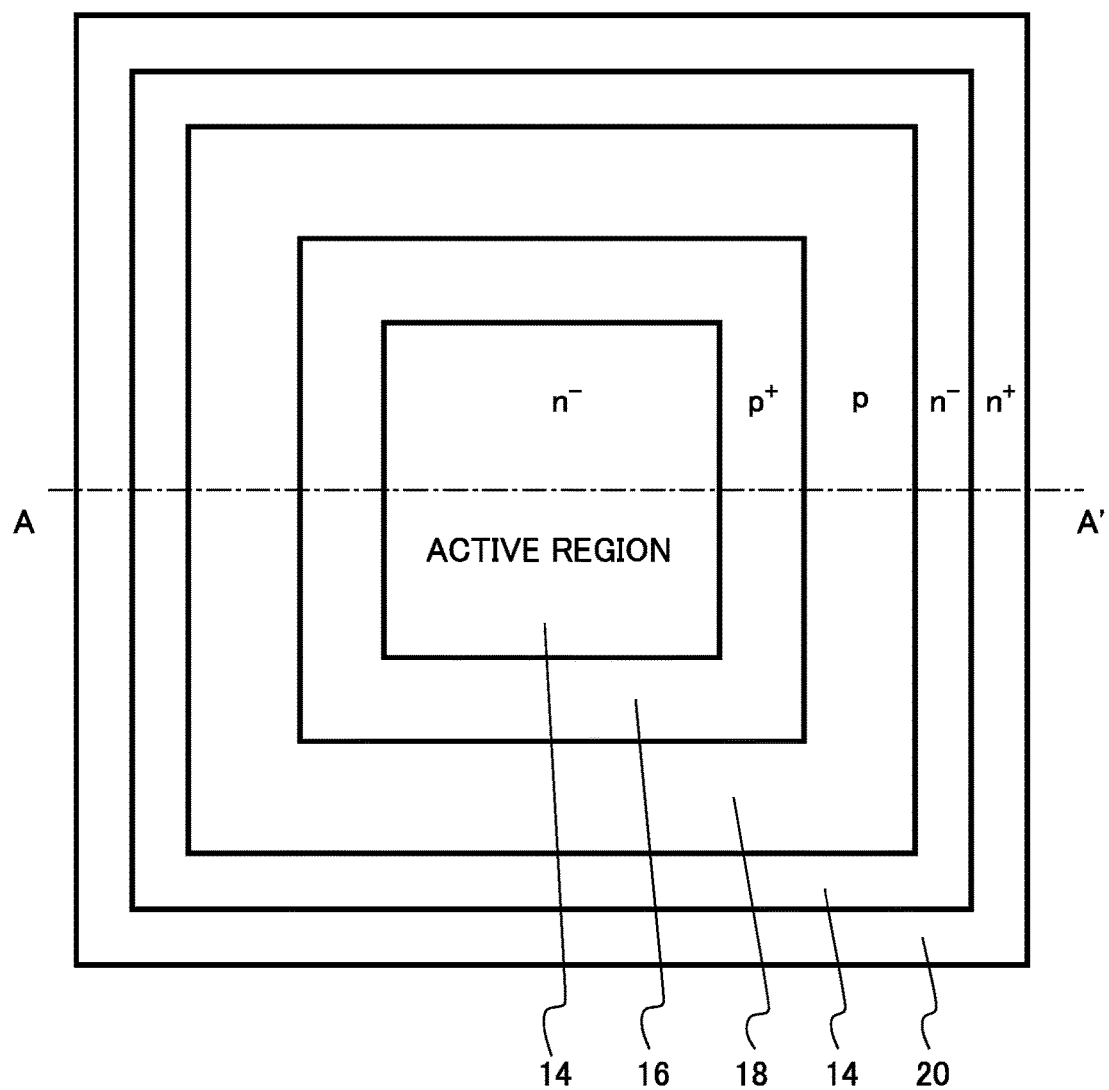

SEMICONDUCTOR DEVICE HAVING A TRIPLE REGION RESURF STRUCTURE

CROSS-REFERENCE TO RELATED APPLICATION

This application is based upon and claims the benefit of priority from Japanese Patent Application No. 2017-178414, filed on Sep. 15, 2017, the entire contents of which are incorporated herein by reference.

FIELD

Embodiments described herein relate generally to semiconductor devices.

BACKGROUND

A termination region is provided around an active region in order to maintain a breakdown voltage of a semiconductor power device. The termination region has a function of reducing the field strength of an end portion of the active region. Therefore, the breakdown voltage of the semiconductor power device is maintained. It is necessary to significantly reduce a termination length which is the length of the termination region in order to reduce a chip size.

A reduced surface field (RESURF) structure or a variable layer doping (VLD) structure based on an impurity layer charge balance (charge compensation) principle is used in order to reduce the length of the termination region. However, in some cases, the breakdown voltage is changed due to a charge imbalance caused by a variation in the impurity concentration of the termination region. When the breakdown voltage is changed due to the variation in the impurity concentration, there is a concern that a desired breakdown voltage will not be obtained. In addition, in some cases, the external charge is propagated to the termination region while the semiconductor power device is operating or when the semiconductor power device is in a standby state. In this case, there is a concern that a charge imbalance will occur, the breakdown voltage will be changed, and reliability the power device will be reduced. For this reason, it is necessary to prevent a variation in breakdown voltage caused by a charge imbalance.

BRIEF DESCRIPTION OF THE DRAWINGS

FIG. 2 is a plan view schematically illustrating the semiconductor device according to the first embodiment;

DETAILED DESCRIPTION

Figure 1:
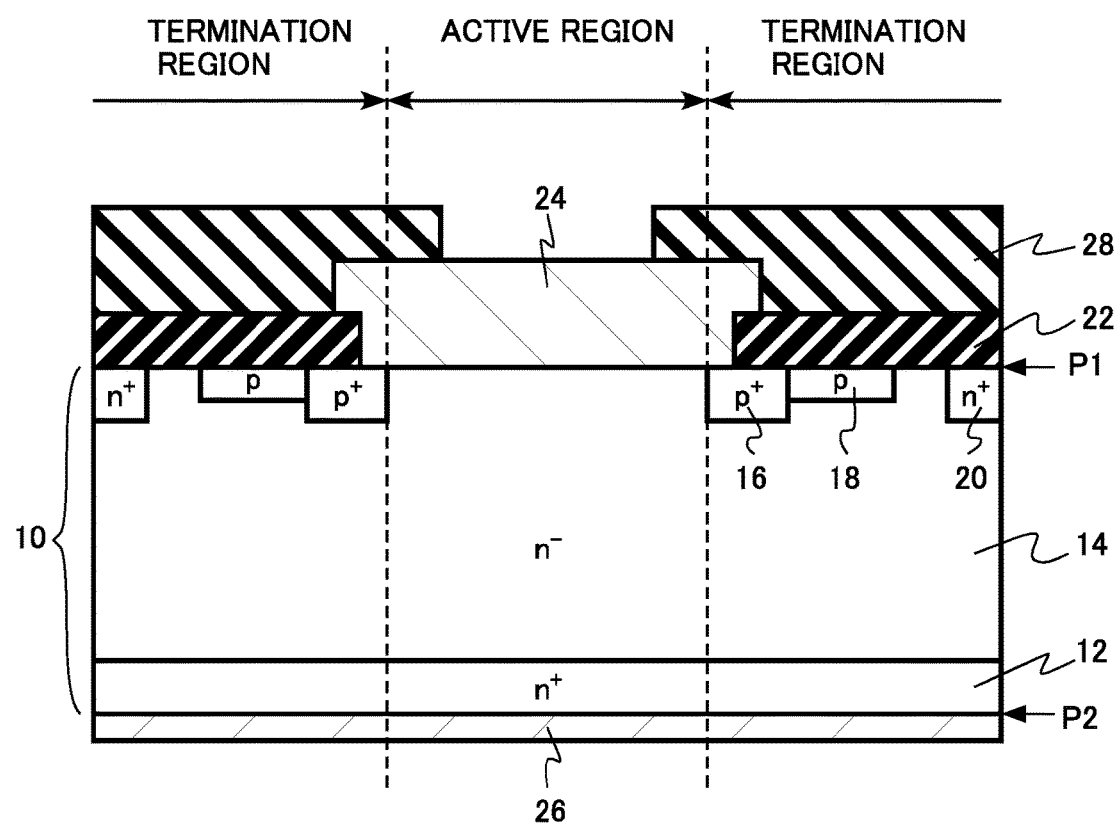
FIG. 1 is a cross-sectional view schematically illustrating a semiconductor device according to a first embodiment.

Hereinafter, embodiments of the invention will be described with reference to the drawings. In the following description, for example, the same or similar members are denoted by the same reference numerals and the description of the members that have been described once will not be repeated.

In the following description, in some cases, $n^+$, n, $n^-$, $p^+$, p, and $p^-$ indicate the relative impurity concentration levels of each conductivity type. That is, $n^+$ indicates a higher n-type impurity concentration than n and $n^-$ indicates a lower n-type impurity concentration than n.

In addition, $p^+$ indicates a higher p-type impurity concentration than p and $p^-$ indicates a lower p-type impurity concentration than p. In some cases, an $n^+$ type and an $n^-$ type are simply referred to as an n type and a $p^+$ type and a $p^-$ type are simply referred to as a p type.

First Embodiment

A semiconductor device according to a first embodiment includes: a semiconductor layer having a first plane and a second plane; a first electrode in contact with the first plane; a second electrode in contact with the second plane; a first semiconductor region of a first conductivity type provided in the semiconductor layer; a second semiconductor region of a second conductivity type provided between the first semiconductor region and the first plane, the second semiconductor region being in contact with the first plane, the second semiconductor region being electrically connected to the first electrode; and a third semiconductor region of the second conductivity type surrounding the second semiconductor region, the third semiconductor region provided between the first semiconductor region and the first plane, the third semiconductor region being in contact with the first plane, the third semiconductor region including a first region, a second region, and a third region, the second region being further away from the second semiconductor region than the first region, the third region being further away from the second semiconductor region than the second region, wherein an amount of second-conductivity-type impurities in the first region, the second region, and the third region is less than an amount of second-conductivity-type impurities in the second semiconductor region, an amount of second-conductivity-type impurities in at least a portion of the first region is less than an amount of second-conductivity-type impurities in at least a portion of the second region, and an amount of second-conductivity-type impurities in at least a portion of the third region is less than an amount of second-conductivity-type impurities in at least a portion of the second region.

FIG. 1 is a cross-sectional view schematically illustrating the semiconductor device according to the first embodiment. FIG. 2 is a plan view schematically illustrating the semiconductor device according to the first embodiment. FIG. 2 illustrates the pattern of impurity regions in an upper surface of the semiconductor device. FIG. 1 illustrates the cross section taken along the line A-A' of FIG. 2. The semiconductor device according to the first embodiment is a Schottky barrier diode (SBD).

The SBD has an active region and a termination region that surrounds the active region. The active region functions as a region in which a current flows mainly when a forward bias is applied in the SBD. The termination region functions as a region that reduces the strength of the electric field applied to an end portion of the active region when a reverse bias is applied in the SBD and improves the breakdown voltage of the SBD.

The SBD includes a semiconductor layer 10, an n$^+$ cathode region 12, an n$^-$ drift region 14 (first semiconductor region), a p$^+$ contact region 16 (second semiconductor region), a p-type RESURF region 18 (third semiconductor region), an n$^+$ equipotential ring region 20, an interlayer insulating layer 22 (insulating layer), an anode electrode 24 (first electrode), a cathode electrode 26 (second electrode), and a passivation layer 28.

The semiconductor layer 10 has a first plane (P1 in FIG. 1) and a second plane (P2 in FIG. 1) that is opposite to the first plane. In FIG. 1, the first plane is an upper surface and the second plane is a lower surface.

The semiconductor layer 10 is made of, for example, single crystal silicon.

The n$^+$ cathode region 12 is provided in the semiconductor layer 10. The cathode region 12 is provided so as to come into contact with the second plane of the semiconductor layer 10.

The cathode region 12 includes n-type impurities. The n-type impurities are, for example, phosphorus (P). The impurity concentration of the n-type impurities is, for example, equal to or greater than $1\times10^{19}$ cm$^{-3}$ and equal to or less than $1\times10^{21}$ cm$^{-3}$.

The cathode region 12 is electrically connected to the cathode electrode 26. The cathode region 12 has a function of reducing the contact resistance between the semiconductor layer 10 and the cathode electrode 26.

The n$^-$ drift region 14 is provided in the semiconductor layer 10. The drift region 14 is provided on the cathode region 12. The drift region 14 is also provided in a portion of the first plane in the active region.

The drift region 14 includes n-type impurities. The n-type impurities are, for example, phosphorus (P). The impurity concentration of the n-type impurities is, for example, equal to or greater than $1\times10^{14}$ cm$^{-3}$ and equal to or less than $1\times10^{16}$ cm$^{-3}$.

The p$^+$ contact region 16 is provided in the semiconductor layer 10. The contact region 16 is provided between the drift region 14 and the first plane. The contact region 16 is provided so as to come into contact with the first plane. The contact region 16 has a ring shape in the first plane.

The contact region 16 includes p-type impurities. The p-type impurities are, for example, boron (B). The impurity concentration of the p-type impurities is, for example, equal to or greater than $5\times10^{19}$ cm$^{-3}$ and equal to or less than $1\times10^{21}$ cm$^{-3}$.

The contact region 16 is electrically connected to the anode electrode 24. The contact region 16 has a function of reducing the contact resistance between the semiconductor layer 10 and the anode electrode 24.

The p-type RESURF region 18 is provided in the semiconductor layer 10. The RESURF region 18 is provided so as to surround the contact region 16. The RESURF region 18 comes into contact with the first plane. The RESURF region 18 comes into contact with the contact region 16. The RESURF region 18 is provided between the drift region 14 and the first plane. The RESURF region 18 has a ring shape in the first plane.

The RESURF region 18 includes p-type impurities. The p-type impurities are, for example, boron (B). The impurity concentration of the RESURF region 18 is lower than the impurity concentration of the contact region. The impurity concentration of the p-type impurities is, for example, equal to or greater than $1\times10^{16}$ cm$^{-3}$ and equal to or less than $1\times10^{19}$ cm$^{-3}$.

The RESURF region 18 has a function that reduces the strength of the electric field applied between the contact region 16 and the drift region 14 when the reverse bias is applied in the SBD and improves the breakdown voltage of the SBD.

The n$^+$ equipotential ring region 20 is provided in the semiconductor layer 10. The equipotential ring region 20 is provided so as to surround the RESURF region 18. The drift region 14 is interposed between the equipotential ring region 20 and the RESURF region 18. The equipotential ring region 20 is provided between the drift region 14 and the first plane. The equipotential ring region 20 comes into contact with the first plane. The equipotential ring region 20 has a ring shape in the first plane.

The equipotential ring region 20 includes n-type impurities. The n-type impurities are, for example, phosphorus (P). The impurity concentration of the n-type impurities is, for example, equal to or greater than $1\times10^{19}$ cm$^{-3}$ and equal to or less than $1\times10^{21}$ cm$^{-3}$. The equipotential ring region 20 has a function of preventing a depletion layer from being spread to an end portion of a semiconductor chip when the reverse bias is applied in the SBD.

The interlayer insulating layer 22 is provided on the first plane of the semiconductor layer 10. The interlayer insulating layer 22 is provided on the contact region 16 and the RESURF region 18. The interlayer insulating layer 22 has an opening portion provided in the active region. The interlayer insulating layer 22 is made of, for example, silicon oxide.

The anode electrode 24 comes into contact with the first plane of the semiconductor layer 10. The anode electrode 24 comes into contact with the first plane in the opening portion of the interlayer insulating layer 22. The contact between the anode electrode 24 and the n$^-$ drift region 14 is a Schottky contact. The contact between the anode electrode 24 and the contact region 16 is an ohmic contact.

The anode electrode 24 is made of metal. The anode electrode 24 is, for example, a stacked film of titanium (Ti) and aluminum (Al).

The cathode electrode 26 comes into contact with the second plane of the semiconductor layer 10. The cathode electrode 26 comes into contact with the cathode region 12. The contact between the cathode electrode 26 and the cathode region 12 is an ohmic contact.

The passivation layer 28 is provided on the interlayer insulating layer 22 and the anode electrode 24. The passivation layer 28 is made of, for example, a resin. The passivation layer 28 is made of, for example, polyimide.

Figure 3A:
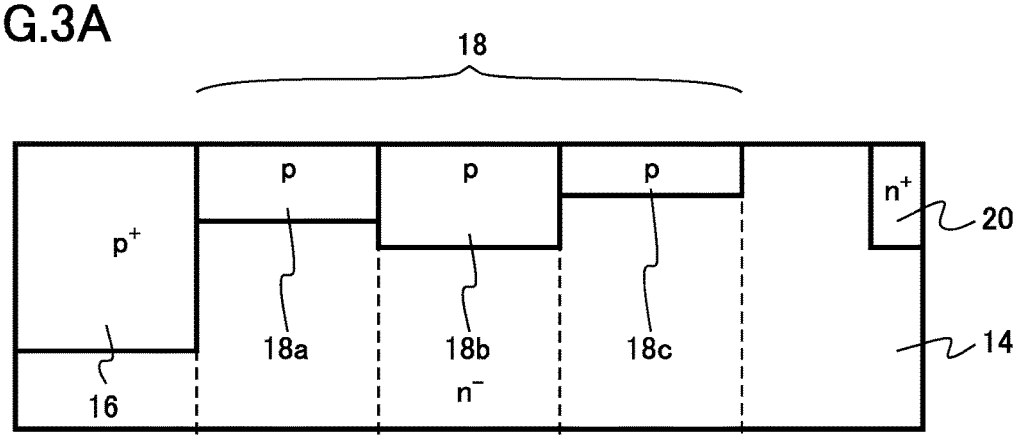
FIGS. 3A, 3B, and 3C are enlarged cross-sectional views schematically illustrating a termination region of the semiconductor device according to the first embodiment.
Figure 3B:
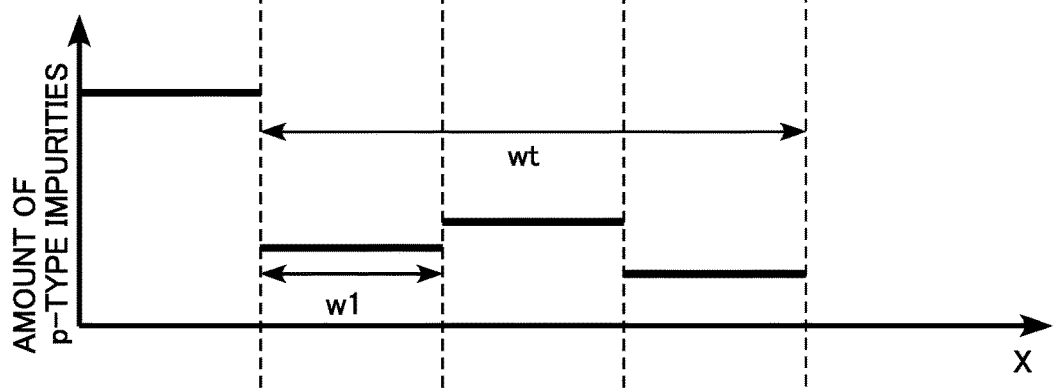
Figure 3C:
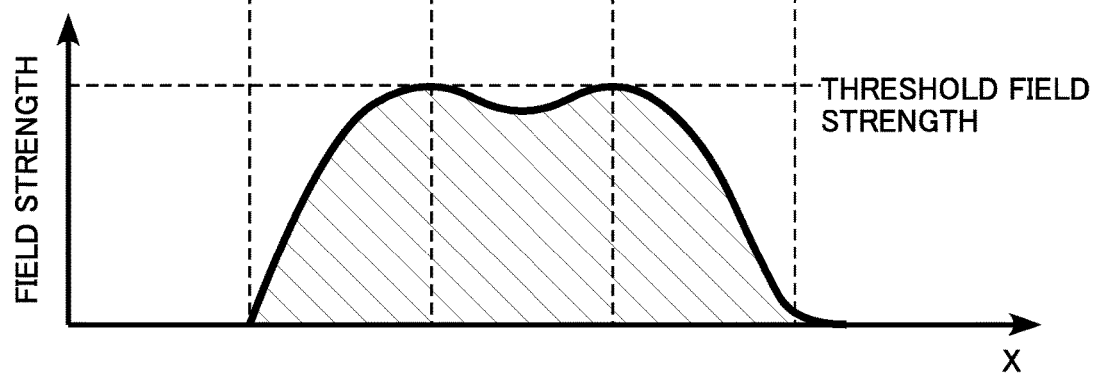

FIGS. 3A, 3B, and 3C are enlarged cross-sectional views schematically illustrating the termination region of the semiconductor device according to the first embodiment. FIG. 3A is a cross-sectional view, FIG. 3B is a diagram illustrating the amounts of p-type impurities in each impurity region, and FIG. 3C is a diagram illustrating a field strength distribution.

The p-type RESURF region 18 includes a first region 18$a$, a second region 18$b$, and a third region 18$c$. The second region 18$b$ is further away from the contact region 16 than the first region 18a. In addition, the third region 18c is further away from the contact region 16 than the second region 18b.

In the SBD according to the first embodiment, the first region 18a, the second region 18b, and the third region 18c have substantially the same p-type impurity concentration.

In the specification, the p-type impurity concentration means a net p-type impurity concentration. The net p-type impurity concentration means a concentration obtained by subtracting the actual n-type impurity concentration from the actual p-type impurity concentration of the semiconductor region.

The depth of the first region 18a is less than the depth of the second region 18b. In addition, the depth of the third region 18c is less than the depth of the second region 18b.

In the specification, the term "depth" means a distance from the first plane to the junction between each region and the drift region 14.

The amount of p-type impurities in the first region 18a, the second region 18b, and the third region 18c is less than the amount of p-type impurities in the contact region 16.

In the specification, the amount of p-type impurities means the amount of net p-type impurities. The amount of net p-type impurities is an amount obtained by subtracting the actual amount of n-type impurities from the actual amount of p-type impurities in the semiconductor region.

In the specification, the amount of p-type impurities simply means an integrated value of the amount of p-type impurities in a depth direction at a specific position. In other words, it is assumed that the amount of p-type impurities means the sum of the amount of p-type impurities in the depth direction in a unit area of the first plane.

In the SBD according to the first embodiment, as illustrated in FIG. 3B, the amount of p-type impurities at an arbitrary position of the first region 18a is less than the amount of p-type impurities at an arbitrary position of the second region 18b. The amount of p-type impurities in the first region 18a is, for example, equal to or less than 90% of the amount of p-type impurities in the second region 18b. In addition, for example, the width (w1 in FIG. 3B) of the first region 18a is equal to or greater than 10% and equal to or less than 40% of the width (wt in FIG. 3B) of the RESURF region 18.

The amount of p-type impurities at an arbitrary position of the third region 18c is less than the amount of p-type impurities at an arbitrary position of the second region 18b.

In the SBD according to the first embodiment, the depth of each region is changed to achieve the above-mentioned relationship between the amounts of p-type impurities.

The concentration and amount of impurities in the semiconductor region can be calculated by, for example, secondary ion mass spectroscopy (SIMS).

The magnitude relationship between the amounts of impurities in the semiconductor regions may be measured by, for example, SIMS or scanning capacitance microscopy (SCM).

The width of the first region 18a or the width of the RESURF region 18 may be determined by, for example, SCM.

As illustrated in FIG. 3C, the field strength distribution of the RESURF region 18 in the SBD according to the first embodiment is a mountain-shaped distribution with two peaks.

The distribution of the amount of p-type impurities in the RESURF region 18 according to the first embodiment can be achieved by forming the first region 18a, the second region 18b, and the third region 18c using independent ion implantation processes. In addition, for example, when p-type impurity ions forming the RESURF region 18 are implanted, the thickness of a resist pattern can be partially changed to achieve the distribution. Furthermore, for example, when the p-type impurity ions are implanted, the density of opening portions in the resist pattern can be partially changed to achieve the distribution, without adding an ion implantation process.

Next, the function and effect of the semiconductor device according to the first embodiment will be described.

In a semiconductor power device, a change in breakdown voltage caused by a charge imbalance which occurs due to a variation in the impurity concentration of a termination region causes problems. When the breakdown voltage is changed due to a variation in the impurity concentration, there is a concern that a desired breakdown voltage will not be obtained. In some cases, while the semiconductor power device is operating or when the semiconductor power device is in a standby state, the external charge is propagated to the termination region. In this case, there is a concern that a charge imbalance will occur and the breakdown voltage will be changed, resulting in low reliability. For this reason, it is necessary to prevent a variation in breakdown voltage caused by the charge imbalance.

Figure 4A:
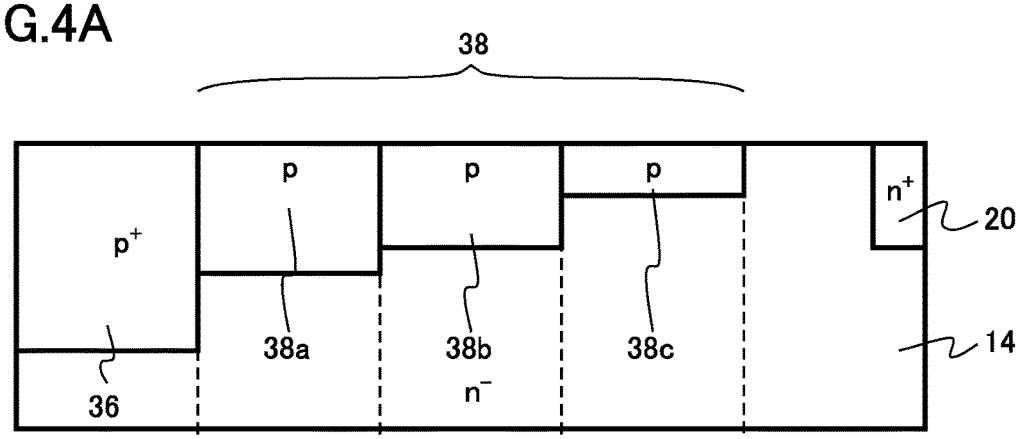
FIGS. 4A, 4B, and 4C are enlarged cross-sectional views schematically illustrating a termination region of a semiconductor device according to a comparative example.
Figure 4B:
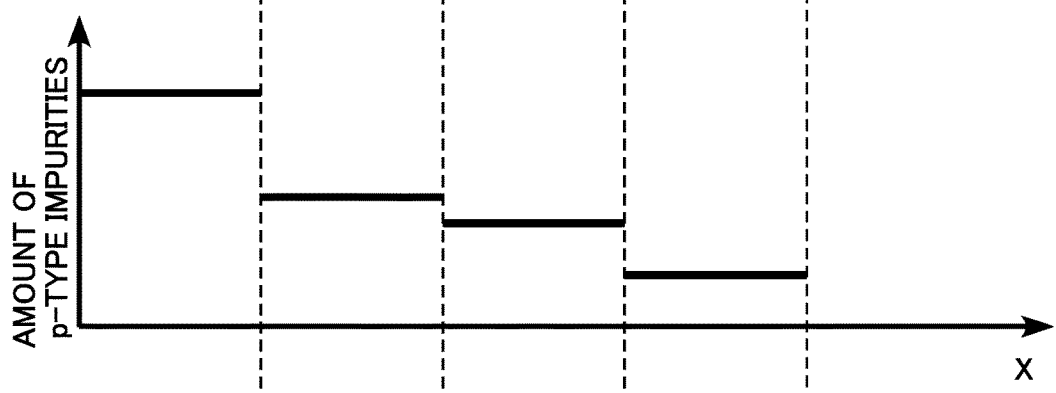
Figure 4C:
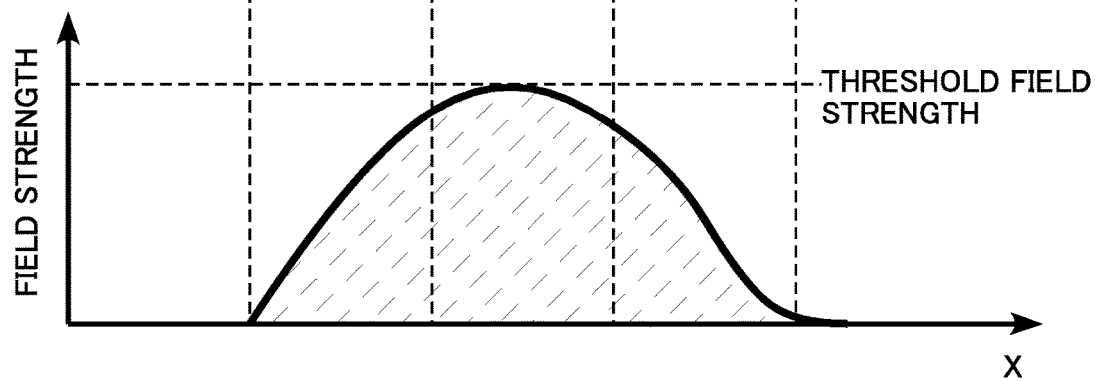

FIGS. 4A, 4B, and 4C are enlarged cross-sectional views schematically illustrating a termination region of a semiconductor device according to a comparative example. FIGS. 4A, 4B, and 4C correspond to FIGS. 3A, 3B, and 3C according to the first embodiment, respectively. FIG. 4A is a cross-sectional view, FIG. 4B is a diagram illustrating the amount of p-type impurities in each impurity region, and FIG. 4C is a diagram illustrating a field strength distribution.

A p-type RESURF region 38 includes a first region 38a, a second region 38b, and a third region 38c. The second region 38b is further away from a contact region 36 than the first region 38a. In addition, the third region 38c is further away from the contact region 36 than the second region 38b.

In an SBD according to the comparative example, similarly to the SBD according to the first embodiment, the first region 38a, the second region 38b, and the third region 38c have substantially the same p-type impurity concentration.

The depth of the second region 38b is less than the depth of the first region 38a. In addition, the depth of the third region 38c is less than the depth of the second region 38b. The depth of the p-type RESURF region 38 is reduced as the distance from the contact region 36 increases, unlike the SBD according to the first embodiment.

In the RESURF region 38 of the SBD according to the comparative example, the amount of p-type impurities at an arbitrary position of the second region 38b is less than the amount of p-type impurities at an arbitrary position of the first region 38a. In addition, the amount of p-type impurities at an arbitrary position of the third region 38c is less than the amount of p-type impurities at an arbitrary position of the second region 38b. The amount of p-type impurities in the p-type RESURF region 38 is reduced as the distance from the contact region 36 increases, unlike the SBD according to the first embodiment.

The structure in which the amount of p-type impurities is reduced as the distance from the contact region 36 increases, such as the RESURF region 38 of the SBD according to the comparative example, is referred to as a variable layer doping (VLD) structure. In the VLD structure, a change in breakdown voltage caused by a charge imbalance is less than that in the structure in which the amount of p-type impurities is uniform.

In the case of the structure in which the amount of p-type impurities is uniform, the field strength distribution has a rectangular shape. In contrast, in the VLD structure, as illustrated in FIG. 4C, the field strength distribution is a mountain-shaped distribution with a peak. Therefore, even when a charge imbalance occurs, it is possible to reduce a change in the breakdown voltage which is determined by the integrated value of the field strength (the area of the field strength distribution).

On the other hand, since the field strength distribution is a mountain-shaped distribution, the VLD structure according to the comparative example has the problem that a termination length for obtaining the same breakdown voltage is greater than that in the RESURF structure in which the field strength distribution has a rectangular shape.

In the SBD according to the first embodiment, the first region 18a with a small amount of p-type impurities is provided at a position that is close to the contact region 16 in the RESURF region 18. In the entire RESURF region 18 of the SBD according to the first embodiment, the amount of p-type impurities at a position that is close to the contact region 16 is small while the VLD structure is maintained. This configuration causes the field strength distribution to be a mountain-shaped distribution with two peaks as illustrated in FIG. 3C.

Figure 5:
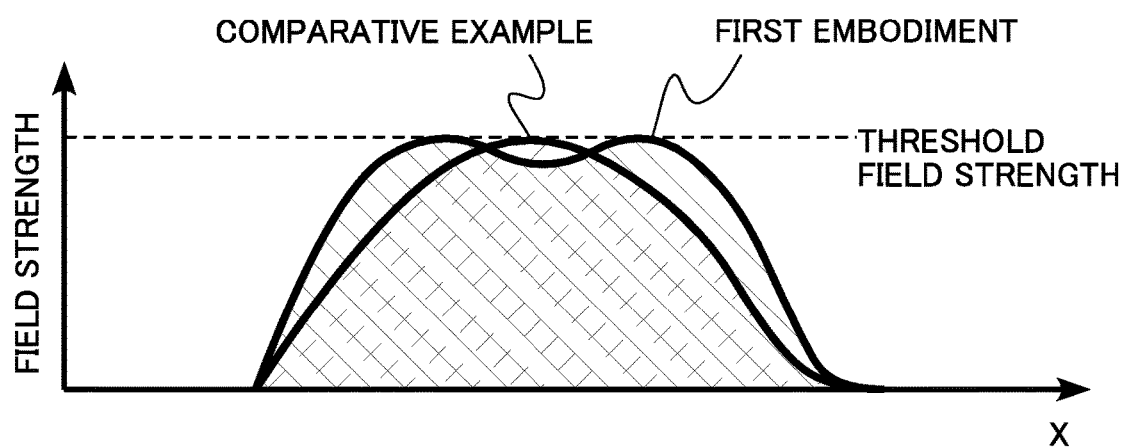
FIG. 5 is a diagram illustrating the function and effect of the semiconductor device according to the first embodiment.

FIG. 5 is a diagram illustrating the function and effect of the semiconductor device according to the first embodiment. FIG. 5 is a diagram illustrating the overlap between the field strength distribution according to the first embodiment and the field strength distribution according to the comparative example.

As can be seen from FIG. 5, the area of the field strength distribution according to the first embodiment is greater than the area of the field strength distribution according to the comparative example. Therefore, when the termination lengths are equal to each other, the breakdown voltage in the first embodiment can be higher than that in the comparative example. In other words, in the first embodiment, the termination length for obtaining the same breakdown voltage can be less than that in the comparative example.

In addition, in the first embodiment, similarly to the comparative example, the field strength distribution is a mountain-shaped distribution with a peak. Therefore, a change in breakdown voltage caused by a charge imbalance is prevented.

The amount of p-type impurities in the first region 18a is preferably equal to or more than 60% and equal to or less than 90% of the amount of p-type impurities in the second region 18b and is more preferably equal to or more than 70% and equal to or less than 80% of the amount of p-type impurities in the second region 18b. When the amount of p-type impurities is less than the above-mentioned range, there is a concern that a field strength peak will be too high and the breakdown voltage will be reduced. When the amount of p-type impurities is more than the above-mentioned range, there is a concern that the field strength peak will not be sufficiently high and the breakdown voltage will be reduced.

The width (w1 in FIG. 3B) of the first region 18a is preferably equal to or greater than 10% and equal to or less than 40% of the width (wt in FIG. 3B) of the RESURF region 18 and is more preferably equal to or greater than 20% and equal to or less than 30% of the width of the RESURF region 18. When the width is less than the above-mentioned range, there is a concern that a field strength peak will not be sufficiently high and the breakdown voltage will be reduced. When the width is greater than the above-mentioned range, there is a concern that the field strength peak will be too high and the breakdown voltage will be reduced.

According to the semiconductor device of the first embodiment, a change in breakdown voltage caused by a charge imbalance is prevented and it is possible to reduce the termination length of the termination region.

Second Embodiment

A semiconductor device according to a second embodiment differs from the semiconductor device according to the first embodiment in that the second-conductivity-type impurity concentration of at least a portion of the first region is lower than the second-conductivity-type impurity concentration of at least a portion of the second region. Hereinafter, the description of a portion of the same content as that in the first embodiment will not be repeated.

Figure 6A:
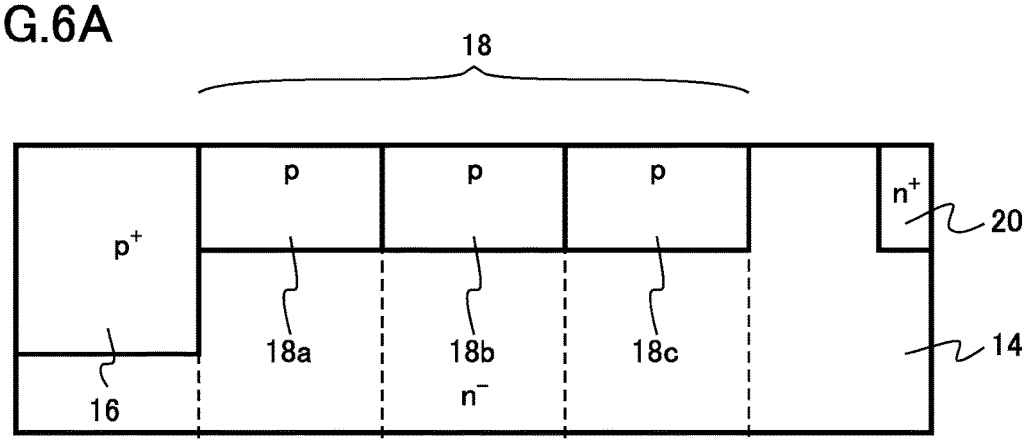
FIGS. 6A, 6B, and 6C are enlarged cross-sectional views schematically illustrating a termination region of a semiconductor device according to a second embodiment.
Figure 6B:
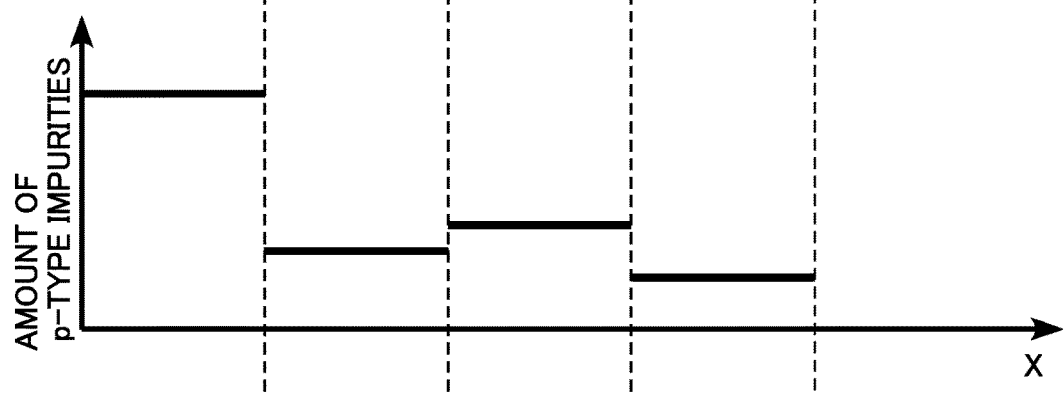
Figure 6C:
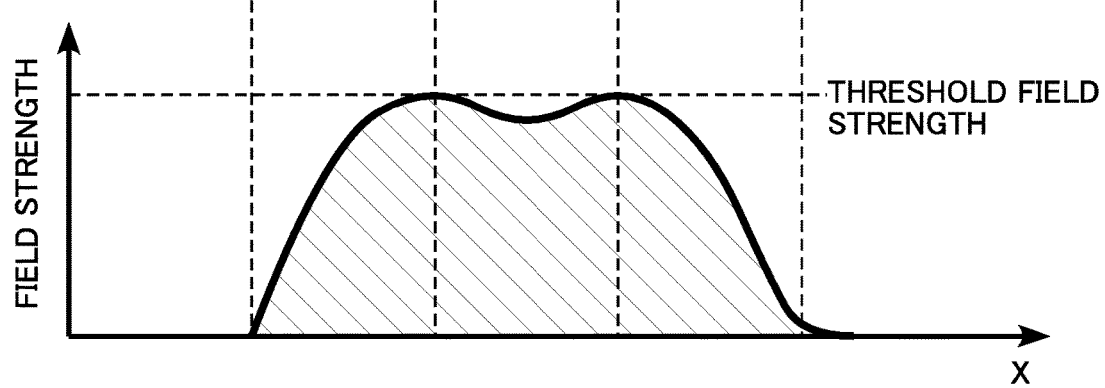

FIGS. 6A, 6B, and 6C are enlarged cross-sectional views schematically illustrating a termination region of the semiconductor device according to the second embodiment. FIG. 6A is a cross-sectional view, FIG. 6B is a diagram illustrating the amount of p-type impurities in each impurity region, and FIG. 6C is a diagram illustrating a field strength distribution.

In an SBD according to the second embodiment, a first region 18a, a second region 18b, and a third region 18c have substantially the same depth.

The concentration of p-type impurities at an arbitrary position of the first region 18a is lower than the concentration of p-type impurities at an arbitrary position of the second region 18b. In addition, the concentration of p-type impurities at an arbitrary position of the third region 18c is lower than the concentration of p-type impurities at an arbitrary position of the second region 18b.

In the SBD according to the second embodiment, the amount of p-type impurities at an arbitrary position of the first region 18a is less than the amount of p-type impurities at an arbitrary position of the second region 18b. In addition, the amount of p-type impurities at an arbitrary position of the third region 18c is less than the amount of p-type impurities at an arbitrary position of the second region 18b.

In the SBD according to the second embodiment, the p-type impurity concentration of each region is changed to achieve the relationship between the amounts of p-type impurities.

According to the semiconductor device of the second embodiment, similarly to the first embodiment, a change in breakdown voltage caused by a charge imbalance is prevented and it is possible to reduce the termination length of the termination region.

Third Embodiment

A semiconductor device according to a third embodiment differs from the semiconductor device according to the first embodiment in that the semiconductor device further includes a fourth semiconductor region of a first conductivity type which is provided between the first region and the first semiconductor region and has a higher first-conductivity-type impurity concentration than the first semiconductor region. Hereinafter, the description of a portion of the same content as that in the first embodiment will not be repeated.

Figure 7A:
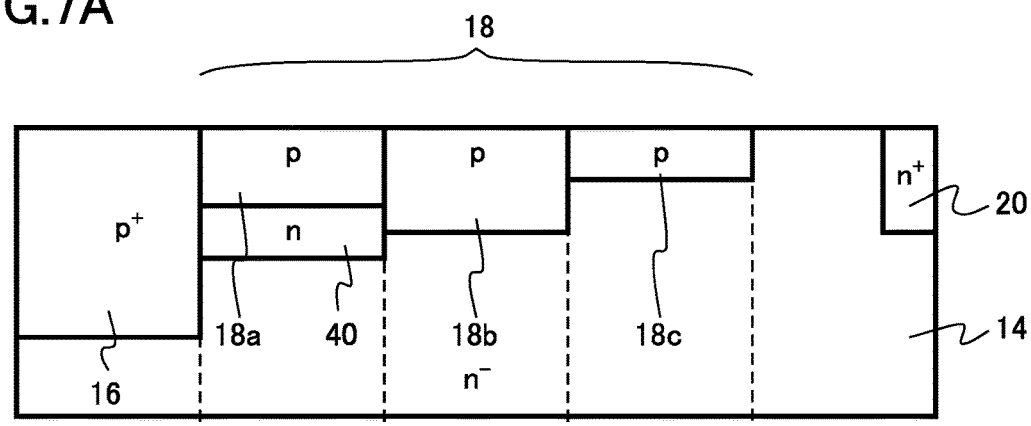
FIGS. 7A, 7B, and 7C are enlarged cross-sectional views schematically illustrating a termination region of a semiconductor device according to a third embodiment.
Figure 7B:
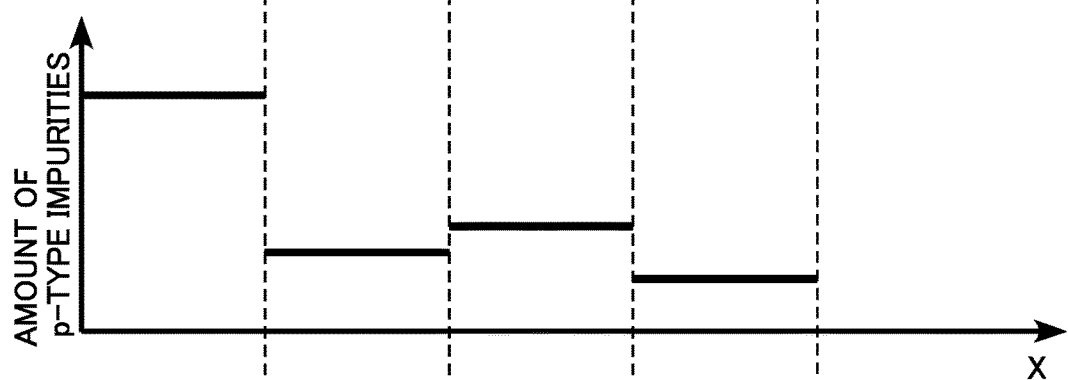
Figure 7C:
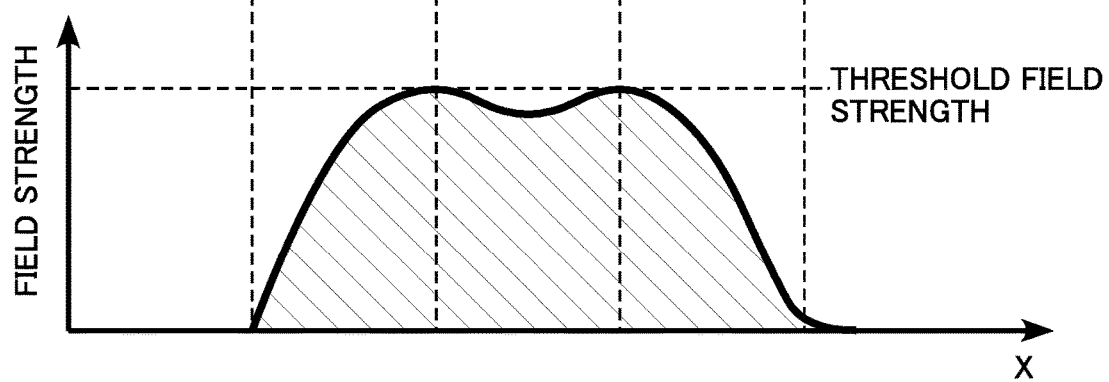

FIGS. 7A, 7B, and 7C are enlarged cross-sectional views schematically illustrating a termination region of the semiconductor device according to the third embodiment. FIG. 7A is a cross-sectional view, FIG. 7B is a diagram illustrating the amount of p-type impurities in each impurity region, and FIG. 7C is a diagram illustrating a field strength distribution.

An SBD according to the third embodiment includes an n-type region 40 (fourth semiconductor region).

In the SBD according to the third embodiment, a first region 18a, a second region 18b, and a third region 18c have substantially the same p-type impurity concentration.

The depth of the first region 18a is less than the depth of the second region 18b. In addition, the depth of the third region 18c is less than the depth of the second region 18b.

The SBD according to the third embodiment includes the n-type region 40. The n-type region 40 is provided between the first region 18a and the drift region 14. The n-type impurity concentration of the n-type region 40 is higher than the n-type impurity concentration of the drift region 14.

The n-type region 40 includes n-type impurities. The n-type impurities are, for example, phosphorus (P). The concentration of the n-type impurities is, for example, equal to or greater than $1 \times 10^{17}$ cm$^{-3}$ and equal to or less than $1 \times 10^{19}$ cm$^{-3}$.

The n-type region 40 is formed by the implantation of n-type impurity ions. The n-type impurities make it possible to compensate for the p-type impurities included in the first region 18a and to adjust the amount of p-type impurities in the first region 18a. Therefore, it is easy to adjust the field strength distribution of the RESURF region 18. As a result, it is easy to adjust the breakdown voltage.

According to the semiconductor device of the third embodiment, similarly to the first embodiment, a change in breakdown voltage caused by a charge imbalance is prevented and it is possible to reduce the termination length of the termination region. In addition, it is easy to adjust the breakdown voltage.

Fourth Embodiment

A semiconductor device according to a fourth embodiment differs from the semiconductor device according to the first embodiment in that the amount of second-conductivity-type impurities in the second region and the amount of second-conductivity-type impurities in the third impurity region are reduced as the distance from the second semiconductor region increases. Hereinafter, the description of a portion of the same content as that in the first embodiment will not be repeated.

Figure 8A:
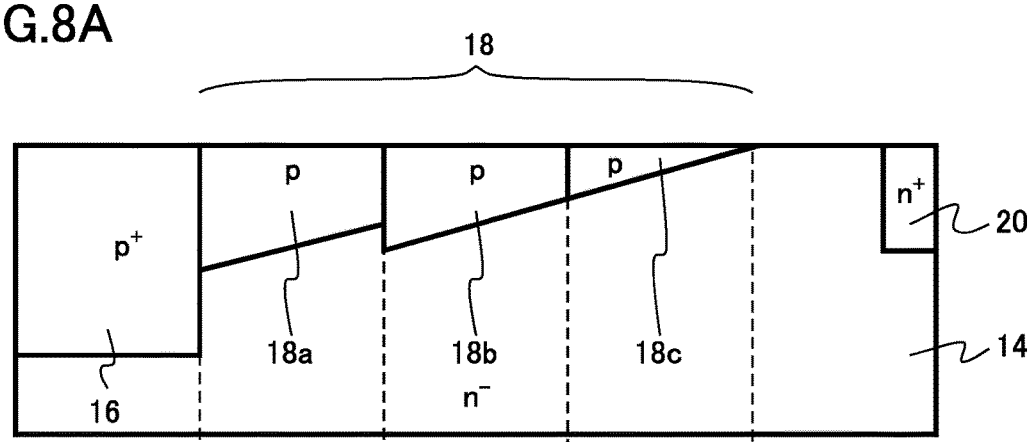
FIGS. 8A, 8B, and 8C are enlarged cross-sectional views schematically illustrating a termination region of a semiconductor device according to a fourth embodiment.
Figure 8B:
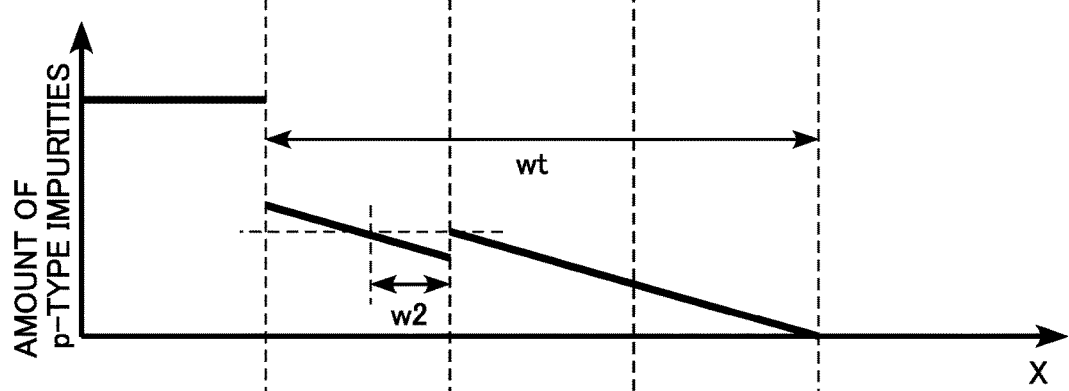
Figure 8C:
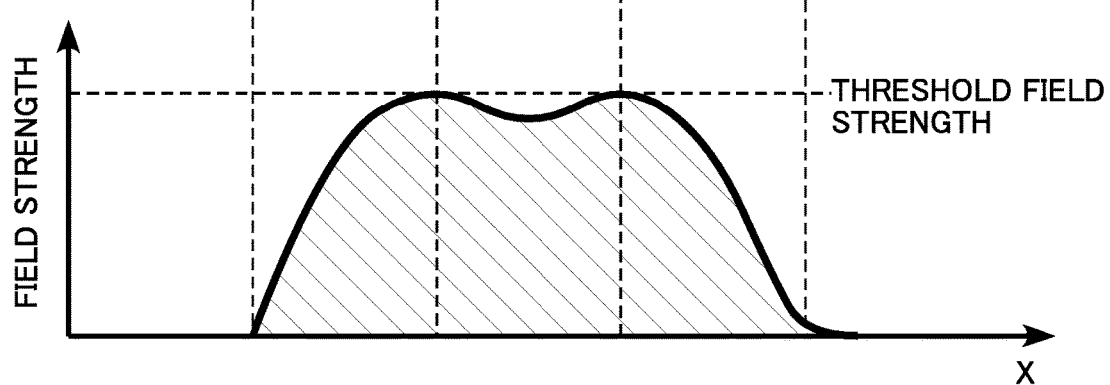

FIGS. 8A, 8B, and 8C are enlarged cross-sectional views schematically illustrating a termination region of the semiconductor device according to the fourth embodiment. FIG. 8A is a cross-sectional view, FIG. 8B is a diagram illustrating the amount of p-type impurities in each impurity region, and FIG. 8C is a diagram illustrating a field strength distribution.

In an SBD according to the fourth embodiment, a first region 18a, a second region 18b, and a third region 18c have substantially the same p-type impurity concentration.

The depth of at least a portion of the first region 18a is less than the depth of at least a portion of the second region 18b. The depth of the first region 18a is less than the depth of the second region 18b at the boundary between the first region 18a and the second region 18b. In addition, the depth of the third region 18c is less than the depth of the second region 18b.

Therefore, the amount of p-type impurities in at least a portion of the first region 18a is less than the amount of p-type impurities in at least a portion of the second region 18b. The amount of p-type impurities in the first region 18a is less than the amount of p-type impurities in the second region 18b at the boundary between the first region 18a and the second region 18b. In addition, the amount of p-type impurities in the third region 18c is less than the amount of p-type impurities in the second region 18b.

The depth of the first region 18a, the depth of the second region 18b, and the depth of the third region 18c are reduced as the distance from the contact region 16 increases. Therefore, the amount of p-type impurities in the first region 18a, the amount of p-type impurities in the second region 18b, and the amount of p-type impurities in the third region 18c are reduced as the distance from the contact region 16 increases.

In the first region 18a, the width (w2 in FIG. 8B) of a portion in which the amount of p-type impurities is less than the amount of p-type impurities in the second region 18b is preferably equal to or greater than 10% and equal to or less than 40% of the width (wt in FIG. 8B) of the RESURF region 18 and is more preferably equal to or greater than 20% and equal to or less than 30% of the width of the RESURF region 18. When the width is less than the above-mentioned range, there is a concern that a field strength peak will not be sufficiently high and the breakdown voltage will be reduced. When the width is greater than the above-mentioned range, the field strength peak will be too high and the breakdown voltage will be reduced.

According to the semiconductor device of the fourth embodiment, similarly to the first embodiment, a change in breakdown voltage caused by a charge imbalance is prevented and it is possible to reduce the termination length of the termination region.

Fifth Embodiment

A semiconductor device according to a fifth embodiment differs from the semiconductor device according to the first embodiment in that the amount of second-conductivity-type impurities in at least a portion of the third region is more than the amount of second-conductivity-type impurities in at least a portion of the second region. Hereinafter, the description of a portion of the same content as that in the first embodiment will not be repeated.

Figure 9A:
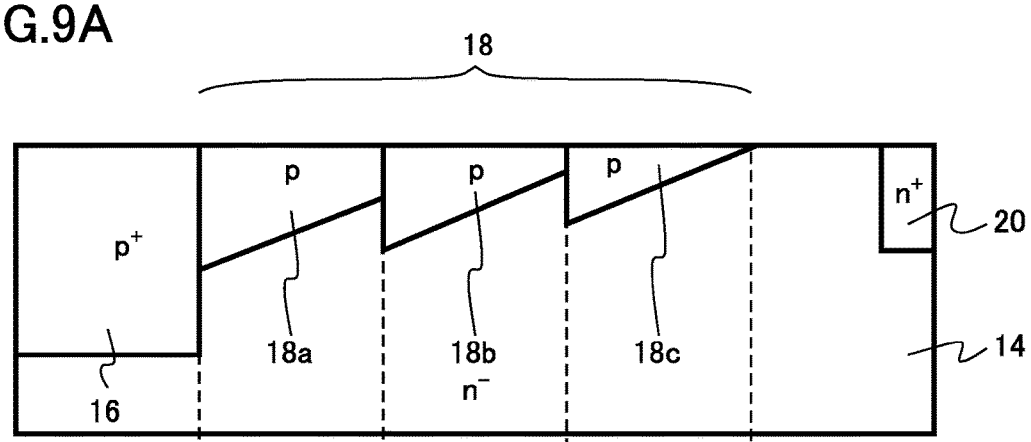
FIGS. 9A, 9B, and 9C are enlarged cross-sectional views schematically illustrating a termination region of a semiconductor device according to a fifth embodiment.
Figure 9B:
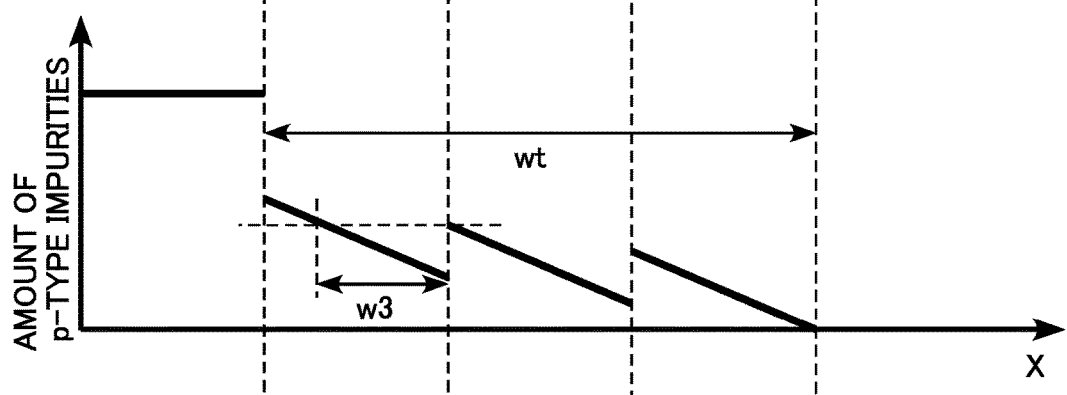
Figure 9C:
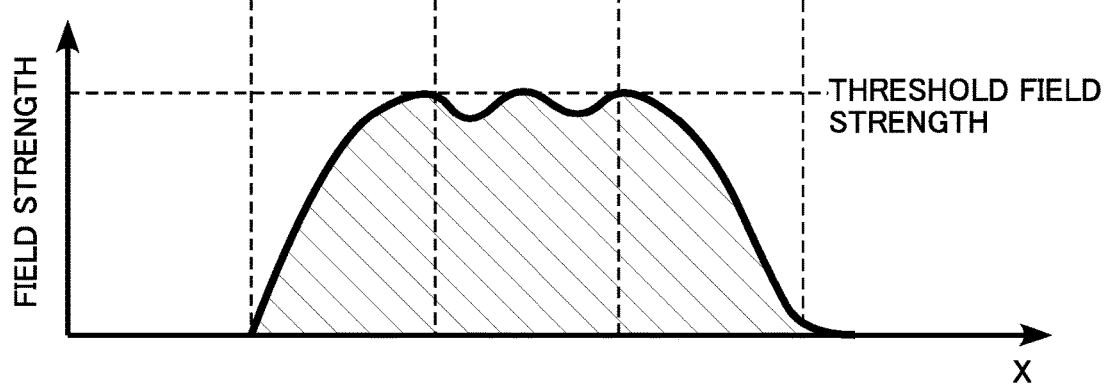

FIGS. 9A, 9B, and 9C are enlarged cross-sectional views schematically illustrating a termination region of the semiconductor device according to the fifth embodiment. FIG. 9A is a cross-sectional view, FIG. 9B is a diagram illustrating the amount of p-type impurities in each impurity region, and FIG. 9C is a diagram illustrating a field strength distribution.

In an SBD according to the fifth embodiment, a first region 18a, a second region 18b, and a third region 18c have substantially the same p-type impurity concentration.

The depth of at least a portion of the first region 18a is less than the depth of at least a portion of the second region 18b. The depth of the first region 18a is less than the depth of the second region 18b at the boundary between the first region 18a and the second region 18b.

In addition, the depth of at least a portion of the third region 18c is greater than the depth of at least a portion of the second region 18b. The depth of the third region 18c is greater than the depth of the second region 18b at the boundary between the third region 18c and the second region 18b.

Therefore, the amount of p-type impurities in at least a portion of the first region 18a is less than the amount of p-type impurities in at least a portion of the second region 18b. The amount of p-type impurities in the first region 18a is less than the amount of p-type impurities in the second region 18b at the boundary between the first region 18a and the second region 18b.

In addition, the amount of p-type impurities in at least a portion of the third region 18c is more than the amount of p-type impurities in at least a portion of the second region 18b. The amount of p-type impurities in the third region 18c is more than the amount of p-type impurities in the second region 18b at the boundary between the third region 18c and the second region 18b.

The depth of the first region 18a, the depth of the second region 18b, and the depth of the third region 18c are reduced as the distance from the contact region 16 increases. Therefore, the amount of p-type impurities in the first region 18a, the amount of p-type impurities in the second region 18b, and the amount of p-type impurities in the third region 18c are reduced as the distance from the contact region 16 increases.

As illustrated in FIG. 9C, the field strength distribution of the RESURF region 18 of the SBD according to the fifth embodiment is a mountain-shaped distribution with three peaks. Therefore, the area of the field strength distribution is greater than that in the first to fourth embodiments. As a result, when the termination length is equal to that in the first to fourth embodiments, the breakdown voltage in the fifth embodiment can be higher than that in the first to fourth embodiments. In other words, in the fifth embodiment, a termination length for obtaining the same breakdown voltage can be less than that in the first to fourth embodiments.

In the first region 18a, the width (w3 in FIG. 9B) of a portion in which the amount of p-type impurities is less than the amount of p-type impurities in the second region 18b is preferably equal to or greater than 10% and equal to or less than 40% of the width (wt in FIG. 9B) of the RESURF region 18 and is more preferably equal to or greater than 20% and equal to or less than 30% of the width of the RESURF region 18. When the width is less than the above-mentioned range, there is a concern that a field strength peak will not be sufficiently high and the breakdown voltage will be reduced. When the width is greater than the above-mentioned range, the field strength peak will be too high and the breakdown voltage will be reduced.

According to the semiconductor device of the fifth embodiment, similarly to the first embodiment, a change in breakdown voltage caused by a charge imbalance is prevented. The termination length of the termination region can be less than that in the first to fourth embodiments.

Sixth Embodiment

A semiconductor device according to a sixth embodiment differs from the semiconductor device according to the fifth embodiment in that the semiconductor device further includes a conductive layer which faces the first plane, with an insulating layer interposed therebetween, and is provided above the boundary between the first region and the second region. Hereinafter, the description of a portion of the same content as that in the fifth embodiment will not be repeated.

Figure 10:
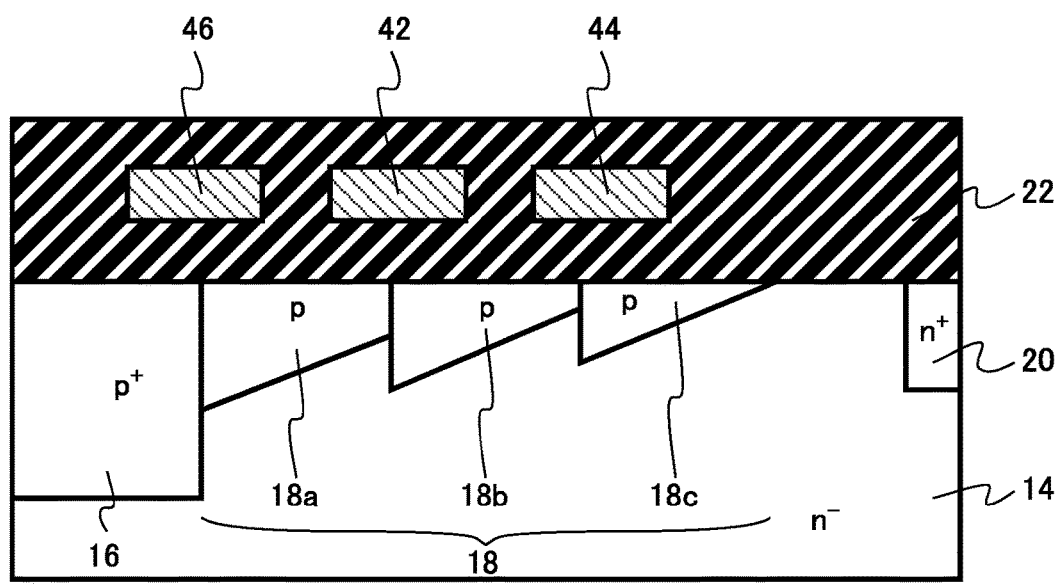
FIG. 10 is an enlarged cross-sectional view schematically illustrating a termination region of a semiconductor device according to a sixth embodiment.

FIG. 10 is an enlarged cross-sectional view schematically illustrating a termination region of the semiconductor device according to the sixth embodiment.

An SBD according to the sixth embodiment includes a first field plate electrode 42 (first conductive layer), a second field plate electrode 44 (second conductive layer), and a third field plate electrode 46.

The first field plate electrode 42 is provided in the interlayer insulating layer 22. The interlayer insulating layer 22 is interposed between the first field plate electrode 42 and the first plane. The first field plate electrode 42 is provided above the boundary between the first region 18a and the second region 18b.

The first field plate electrode 42 is made of, for example, metal. The first field plate electrode 42 may be floating or may have the same potential as the contact region 16.

The second field plate electrode 44 is provided in the interlayer insulating layer 22. The interlayer insulating layer 22 is interposed between the second field plate electrode 44 and the first plane. The second field plate electrode 44 is provided above the boundary between the second region 18b and the third region 18c.

The second field plate electrode 44 is made of, for example, metal. The second field plate electrode 44 may be floating or may have the same potential as the contact region 16.

The third field plate electrode 46 is provided in the interlayer insulating layer 22. The interlayer insulating layer 22 is interposed between the third field plate electrode 46 and the first plane. The third field plate electrode 46 is provided above the boundary between the contact region 16 and the first region 18a.

The third field plate electrode 46 is made of, for example, metal. The third field plate electrode 46 may be floating or may have the same potential as the contact region 16.

The first field plate electrode 42, the second field plate electrode 44, and the third field plate electrode 46 cause the peak of the field strength distribution to be gentle. Therefore, the area of the field strength distribution is greater than that in the fifth embodiment. As a result, when the termination length is the same as that in the fifth embodiment, the breakdown voltage in the sixth embodiment can be higher than that in the fifth embodiment. In other words, in the sixth embodiment, a termination length for obtaining the same breakdown voltage can be less than that in the fifth embodiment.

Each of the first field plate electrode 42, the second field plate electrode 44, and the third field plate electrode 46 has the effect of making the peak of the field strength distribution gentle. Therefore, one or two of the first field plate electrode 42, the second field plate electrode 44, and the third field plate electrode 46 may be omitted.

According to the semiconductor device of the sixth embodiment, similarly to the fifth embodiment, a change in breakdown voltage caused by a charge imbalance is prevented. The termination length of the termination region can be less than that in the fifth embodiment.

In the above-described embodiments, the semiconductor layer is made of silicon. However, the semiconductor layer may be made of other semiconductors such as SiC-based semiconductors and GaN-based semiconductors.

In the above-described embodiments, the SBD is given as an example of the power semiconductor device. However, the invention can be applied to other power semiconductor devices, such as a PIN diode, a metal insulator semiconductor field effect transistor (MISFET), and an insulated gate bipolar transistor (IGBT), as long as the devices have a termination region provided around an active region.

In the above-described embodiments, the first conductivity type is an n type and the second conductivity type is a p type. However, the first conductivity type may be a p type and the second conductivity type may be an n type.

In the above-described embodiments, when the first region 18a, the second region 18b, and the third region 18c have substantially the same p-type impurity concentration, the depths of the first region 18a, the second region 18b, and the third region 18c are substantially equal to each other. However, both the p-type impurity concentration and the depth may be changed to establish a desired relationship between the amounts of p-type impurities.

In the above-described embodiments, the RESURF region 18 is divided into three regions. However, for example, the RESURF region 18 may be divided into four or more regions. For example, in the first embodiment, a new p-type region may be provided outside the third region 18c such that the amount of p-type impurities is reduced in fine steps toward the outside.

In addition, an insulating layer with a low insulating performance may be provided on the termination region in order to improve reliability.

While certain embodiments have been described, these embodiments have been presented byway of example only, and are not intended to limit the scope of the inventions. Indeed, the semiconductor devices described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
  a semiconductor layer having a first plane and a second plane;
  a first electrode in contact with the first plane;
  a second electrode in contact with the second plane;
  a first semiconductor region of a first conductivity type provided in the semiconductor layer;
  a second semiconductor region of a second conductivity type provided between the first semiconductor region and the first plane, the second semiconductor region being in contact with the first plane, the second semiconductor region being electrically connected to the first electrode; and
  a third semiconductor region of the second conductivity type surrounding the second semiconductor region, the third semiconductor region provided between the first semiconductor region and the first plane, the third semiconductor region being in contact with the first plane, the third semiconductor region including a first region, a second region, and a third region, the second region being further away from the second semiconductor region than the first region, the third region being further away from the second semiconductor region than the second region,
  wherein an amount of second-conductivity-type impurities in the first region, the second region, and the third region is less than an amount of second-conductivity-type impurities in the second semiconductor region,
  an amount of second-conductivity-type impurities in at least a portion of the first region is less than an amount of second-conductivity-type impurities in at least a portion of the second region, and
  an amount of second-conductivity-type impurities in at least a portion of the third region is less than an amount of second-conductivity-type impurities in at least a portion of the second region.

2. The semiconductor device according to claim 1, wherein a depth of at least a portion of the first region is less than a depth of at least a portion of the second region.

3. The semiconductor device according to claim 1, wherein a second-conductivity-type impurity concentration of at least a portion of the first region is lower than a second-conductivity-type impurity concentration of at least a portion of the second region.

4. The semiconductor device according to claim 1, wherein an amount of second-conductivity-type impurities in at least a portion of the first region is equal to or less than 90% of an amount of second-conductivity-type impurities in at least a portion of the second region.

5. The semiconductor device according to claim 1, further comprising:
  a fourth semiconductor region of the first conductivity type provided between the first region and the first semiconductor region, the fourth semiconductor region having a higher first-conductivity-type impurity concentration than the first semiconductor region.

6. The semiconductor device according to claim 1, wherein a width of a portion, in which an amount of second-conductivity-type impurities is less than an amount of second-conductivity-type impurities in at least a portion of the second region, in the first region is equal to or greater than 10% and equal to or less than 40% of a width of the third semiconductor region.

7. The semiconductor device according to claim 1, wherein an amount of second-conductivity-type impurities in an second region and an amount of second-conductivity-type impurities in the third region are reduced as a distance from the second semiconductor region increases.

8. The semiconductor device according to claim 1, wherein an amount of second-conductivity-type impurities in at least a portion of the third region is more than an amount of second-conductivity-type impurities in at least a portion of the second region.

9. The semiconductor device according to claim 1, further comprising:
  an insulating layer provided on the first plane; and
  a first conductive layer provided above a boundary between the first region and the second region, the insulating layer being interposed between the first conductive layer and the first plane.

10. The semiconductor device according to claim 9, further comprising:
  a second conductive layer provided above a boundary between the second region and the third region, the insulating layer being interposed between the second conductive layer and the first plane.

11. The semiconductor device according to claim 1, wherein the first conductivity type is an n type and the second conductivity type is a p type.

* * * * *